US009259905B2

(12) United States Patent
Wilken et al.

(10) Patent No.: US 9,259,905 B2
(45) Date of Patent: Feb. 16, 2016

(54) METHOD FOR CONNECTING SUBSTRATES, AND COMPOSITE STRUCTURE OBTAINABLE THEREBY

(75) Inventors: Ralph Wilken, Rastede (DE); Jorg Ihde, Lilienthal (DE); Christoph Regula, Bremen (DE)

(73) Assignee: FRAUNHOFER-GESELLSCHAFT ZUR FÖDERUNG DER ANGEWANDTEN FORSCHUNG E.V., München (DE)

( * ) Notice: Subject to any disclaimer, the term of this patent is extended or adjusted under 35 U.S.C. 154(b) by 200 days.

(21) Appl. No.: 13/885,226

(22) PCT Filed: Nov. 17, 2011

(86) PCT No.: PCT/EP2011/070387
§ 371 (c)(1),
(2), (4) Date: Jul. 11, 2013

(87) PCT Pub. No.: WO2012/066096
PCT Pub. Date: May 24, 2012

(65) Prior Publication Data
US 2013/0280539 A1   Oct. 24, 2013

(30) Foreign Application Priority Data
Nov. 18, 2010 (DE) .......... 10 2010 044 114

(51) Int. Cl.
*B32B 37/12* (2006.01)
*B05D 1/00* (2006.01)
(Continued)

(52) U.S. Cl.
CPC ............. *B32B 37/1284* (2013.01); *B05D 1/62* (2013.01); *C09J 5/02* (2013.01); *C23C 16/30* (2013.01);
(Continued)

(58) Field of Classification Search
CPC ............. B05D 1/62; C09J 5/02; C23C 16/30; C23C 16/452; H01J 37/32825; B32B 37/1284
See application file for complete search history.

(56) References Cited

U.S. PATENT DOCUMENTS 2,757,189 A * 7/1956 Clasen et al. .......... 556/450
4,619,861 A   10/1986 Nakayama et al.
(Continued)

FOREIGN PATENT DOCUMENTS

DE   4242059 C1   3/1994
DE   4407478 A1   9/1994
(Continued)

OTHER PUBLICATIONS

Bringmann, Philipp, et al. "Atmospheric pressure plasma deposition of adhesion promotion layers on aluminum," Plasma Processes & Polymers. 6, 5496-5502 (2009).
(Continued)

*Primary Examiner* — Daniel McNally
(74) *Attorney, Agent, or Firm* — Scott R. Cox (57) ABSTRACT

The invention relates to a method for connecting substrates including depositing a plasma polymer layer on each of a first and a second substrate by means of atmospheric pressure plasma and bringing the plasma polymer layers in contact with each other. In a variant of the method, only the first substrate is provided with a plasma polymer layer and connected to a second substrate, the surface of which can react with the plasma polymer layer. The invention further relates to composite structures which can be obtained with such methods.

19 Claims, 4 Drawing Sheets (51) Int. Cl.
*C09J 5/02* (2006.01)
*C23C 16/30* (2006.01)
*C23C 16/452* (2006.01)
*H01J 37/32* (2006.01)
*B05D 3/04* (2006.01)
*B29C 65/00* (2006.01)

(52) U.S. Cl.
CPC ......... *C23C 16/452* (2013.01); *H01J 37/32825* (2013.01); *B05D 3/0486* (2013.01); *B05D 2203/30* (2013.01); *B29C 66/00145* (2013.01); *B29C 66/028* (2013.01); *B29C 66/45* (2013.01); *B29C 66/742* (2013.01); *B29C 66/7465* (2013.01); *B29C 66/919* (2013.01); *B29C 66/91411* (2013.01); *B29C 66/91945* (2013.01); *C09J 2400/143* (2013.01); *C09J 2400/146* (2013.01); *C09J 2400/163* (2013.01); *C09J 2400/166* (2013.01); *C09J 2400/226* (2013.01); *C09J 2400/228* (2013.01); *Y10T 428/31612* (2015.04); *Y10T 428/31663* (2015.04)

(56) References Cited

U.S. PATENT DOCUMENTS

| | | | |
|---|---|---|---|
| 5,837,958 | A | 11/1998 | Fornsel |
| 6,528,170 | B2 | 3/2003 | Baalmann et al. |
| 6,677,550 | B2 | 1/2004 | Fornsel et al. |
| 6,800,336 | B1 | 10/2004 | Fornsel et al. |
| 7,157,145 | B2 | 1/2007 | Vissing et al. |
| 8,048,530 | B2 | 11/2011 | Haack et al. |
| 2007/0065582 | A1* | 3/2007 | Haack et al. ............. 427/255.18 |
| 2008/0118734 | A1* | 5/2008 | Goodwin et al. ............. 428/221 |
| 2010/0193120 | A1* | 8/2010 | Matsuo ..................... 156/272.6 |

FOREIGN PATENT DOCUMENTS

| | | |
|---|---|---|
| DE | 19856227 A1 | 6/2000 |
| DE | 10017846 C2 | 3/2002 |
| DE | 102005042109 A1 | 3/2007 |
| DE | 102005059706 A1 | 6/2007 |
| JP | 2009027120 A | 2/2009 |
| JP | 2009028920 A | 2/2009 |
| JP | 2009028923 A | 2/2009 |
| JP | 2010107680 A | 5/2010 |
| WO | 0078469 A2 | 12/2000 |
| WO | 2004035857 A2 | 4/2004 |
| WO | 2006124437 A1 | 11/2006 |
| WO | 2007028798 A1 | 3/2007 |
| WO | 2008014607 A1 | 2/2008 |
| WO | 2008090701 A1 | 7/2008 |

OTHER PUBLICATIONS

Gupta, Munish. "Low-pressure and atmospheric pressure plasma polymerized silica-like films as primers for adhesive bonding of aluminum," 1-215 (Jan. 1, 2007).

Pihan, S.A., et al. "Plasma polymerized hexamethyl disiloxane in adhesion applications," Surface and Coatings Technology. 203, 1856-1862, Elsevier, Amsterdam (2009).

English translation of International Search Report, dated Jan. 30, 2012, with respect to International Application Serial No. PCT/EP2011/070387.

Bringmann, Philipp, et al. "Atmospheric pressure plasma deposition of adhesion promotion layers on aluminum," Plasma Processes & Polymers. 6, S496-S502 (2009).

English translation of JPO Notification of Reason for Rejection, dated May 19, 2015, with respect to parallel Japanese Application JP 2013-539266.

* cited by examiner

Fig. 5b

METHOD FOR CONNECTING SUBSTRATES, AND COMPOSITE STRUCTURE OBTAINABLE THEREBY

FIELD OF THE INVENTION

The present invention relates to methods for connecting substrates and to a composite structure obtainable with said methods. The method according to the invention is based on the surprising finding that plasma polymer layers deposited by means of an atmospheric pressure plasma beam allow for a, preferably bonded, connection of substrates, for example of parts to be joined or particles, in that the plasma polymer layers are merely brought into contact with each other. No further auxiliary agent, particularly no adhesive, is required for this.

PRIOR ART

Plasma processes for pretreating substrates are known. In DE 44 07 478 88, fibre-reinforced plastics having polymeric surfaces are subjected to a low-pressure plasma treatment before application of the adhesive. EP 0 761 415 A2 relates to a method for pretreating the surface of workpieces by sweeping a plasma beam over the surface. The surface is to be changed thereby so that it can be wet by liquids such as adhesives and varnishes. Such pretreatments of substrates in plasma are particularly of interest for materials having poor adhesive properties. Examples of such materials are polyolefins (PP, PE), fluoroorganic polymers (PTFE, ETFE, PVDF), silicones, etc.

WO 01/32949 A1 is concerned with atmospheric pressure plasma processes for coating surfaces. Here, a precursor material is reacted by means of a plasma, and the reaction product is deposited on the surface. Coatings of this kind, obtained using hexamethyldisiloxane, tetraethoxysilane or propane as the precursor gas, are generally associated with good adhesion to the base surface and stability in relation to alcoholic solvents.

Adhesive plasma polymer layers are described in WO 2004/035857 A2. To produce adhesive layers of this kind, the precursor material in plasma state is deposited on the substrate in such a manner that at least part of its double and/or triple bonds remain intact. Plasma polymer layers of this kind allow, for example, EPDM to be vulcanized on. In this process, the double bonds of the adhesion promoting layer react with the EPDM via the vulcanizing agent. The adhesive plasma polymer layer is thus connected to the EPDM via an additional agent.

WO 00/78469 A2 relates to a method for applying a coating containing reactive epoxy groups to a substrate. In this method, the substrate is subjected to plasma discharge in the presence of specific epoxy compounds. An additional coupling agent such as, e.g., diamine is required when using this coating for connecting two substrates, since the epoxy compounds are unable to react among each other.

In the method of DE 42 42 059 C1, molded plastic articles are connected to further plastic components in that an intermediate layer is applied by means of plasma polymerization to at least one of the surfaces to be joined, whereupon large-area welding or hot melt gluing is performed while supplying heat. Here, plasma polymerization occurs in a low-pressure plasma.

The Japanese patent applications JP-A-2009027120, JP-A-2009028920 and JP-A-2009028923 equally relate to methods for connecting materials in the presence of plasma polymer layers. According to the teaching of JP-A-2009028920, a low-pressure plasma apparatus as is illustrated in FIG. 1 of this publication is used for deposition of the plasma polymer layers.

In view of the prior art described above, the inventors have set themselves the object of providing a particularly simple method for connecting, and preferably bonding, substrates, which can dispense with further auxiliary agents, for example adhesives.

SUMMARY OF THE INVENTION

This object is achieved, in accordance with the invention, by a method for connecting substrates as is specified in the Application. The method is characterized in that, in a first step, plasma polymer layers are deposited by means of an atmospheric pressure plasma to at least one of the substrates to be connected. One invention thereby relates to that variant of the method in which both substrates that are to be connected are provided with a plasma polymer layer. That variant in which only one of the substrates is provided with the plasma polymer layer and is brought into contact, for connection purposes, with a second substrate having a surface capable of reacting with this layer, is the subject matter of another invention.

As the inventors have surprisingly found, plasma polymer layers have such a high residual reactivity following atmospheric pressure plasma deposition that it is sufficient for them to be merely brought into contact with suitable second substrates so that a chemical reaction occurs between the partners to be joined and connects these to each other. Those substrates are "suitable" thereby which are both provided with plasma polymer layers capable of chemically reacting with each other. As an alternative, it is also possible for only one substrate to be provided with a plasma polymer layer, provided that the surface of the second substrate is such that it can react with the plasma polymer layer of the first substrate. Furthermore, the plasma polymer layer is already cross-linked to such an extent immediately after the deposition in step (i) that no displacement of the plasma polymer results when bringing the substrates into contact, for example by pressing them together.

Preferred configurations of the method according to the invention are the subject matter of the dependent patent claims.

According to a further aspect, the present invention relates to a composite structure comprising a first and a second substrate. The substrates in the composite structure are connected via a plasma polymer layer obtainable with the method according to the invention.

BRIEF DESCRIPTION OF THE DRAWINGS

FIG. 4 shows IR spectra of plasma polymer layers deposited in atmospheric pressure plasma before (FIG. 4a) and after (FIG. 4b) tempering.

FIG. 5 shows IR spectra of plasma polymer layers deposited in low-pressure plasma before (FIG. 5a) and after (FIG. 5b) tempering.

DETAILED DESCRIPTION OF THE INVENTION

In both variants of the method according to the invention, a plasma polymer layer is deposited on a substrate by means of an atmospheric pressure plasma. The plasma polymers of the layer are accordingly formed from precursor compounds by the action of an atmospheric pressure plasma. "Atmospheric pressure plasma", also known as AP plasma or normal pressure plasma, is understood to mean plasma in which the pressure approximately matches atmospheric pressure. C. Tendero et al. in "Atmospheric pressure plasmas: A review", Spectrochimica Acta Part B: Atomic Spectroscopy, 2005, provide an overview of atmospheric pressure plasmas. The atmospheric pressure plasmas that can be employed in the method according to the invention may be produced by different types of excitation. AC (alternating current) excitation, DC (direct current) and low-frequency excitation, RF excitation and microwave excitation, also in pulsed form, can be considered here. Preferably, the atmospheric pressure plasma used according to the invention is produced by means of pulsed high-frequency excitation. There are no particular limits to the pulse frequency which may range from 5 to 100 kHz, with the range of from 10 to 50 kHz being preferred.

Due to its ease of handling, a plasma nozzle is advantageously used in the method according to the invention to produce the atmospheric pressure plasma. The basic structure of a plasma nozzle will now be explained in more detail with reference to FIG. 3. The plasma nozzle 6 has an electroconductive housing 21 that is preferably designed to be elongate, particularly tubular. The housing forms a nozzle channel 22 which has a process gas flowing through. An electrode 23 is arranged, preferably coaxially, in the nozzle channel. A tube 24 of dielectric material, e.g. a ceramic tube, is inserted in the nozzle channel 22. A voltage is applied between the electrode and the housing by means of a high-frequency generator 25. The process gas 20 is preferably passed through a conduit 26 into the nozzle channel in such a manner that it flows through the channel in a swirl-like fashion. This flow of the process gas can be achieved by means of a swirling device 27. This may be a plate with holes. Nitrogen, oxygen, hydrogen, inert gases (particularly argon), ammonia ($NH_3$), hydrogen sulphide ($H_2S$) and mixtures thereof, particularly compressed air, nitrogen-hydrogen mixtures and mixtures of noble gases and hydrogen, are examples of process gases that may be used in plasma nozzles.

Figure 3:
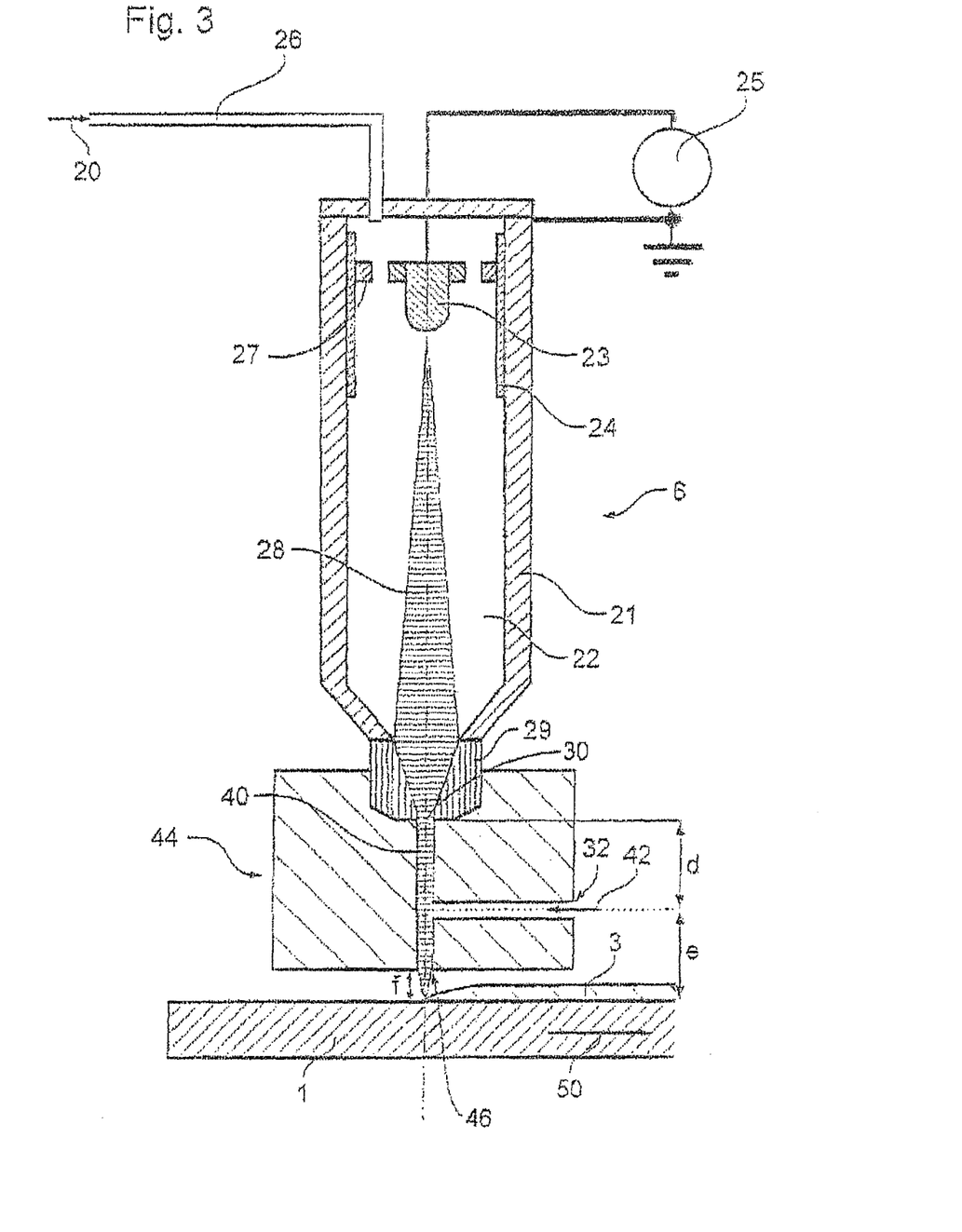
FIG. 3 illustrates the deposition of the plasma polymer layer in step (i) by feeding precursor compounds of this layer into the relaxing region of the atmospheric pressure plasma beam.

During operation of the atmospheric pressure plasma nozzle, the plasma discharge 28 resembling an electric arc extends from the tip of the central electrode 23 substantially in an axial direction of the nozzle channel 23 to the counter electrode 29 that is grounded just as the housing 21. This causes a plasma beam 40 to exit right below the nozzle outlet 30.

The mode of operation of a plasma nozzle is known to the person skilled in the art and is described, for example, in DE-A-195 32 412 as well as in DE-U-299 21 694. In accordance therewith, a plasma beam in the form of a "flame" is generated below the nozzle aperture during operation of the plasma nozzle. Plasma nozzles of any kind can, in principle, be used in the method according to the invention. According to a preferred embodiment, plasma nozzles are employed as are described in DE-A-195 32 412 or DE-U-299 21 684. The use of plasma nozzles comprised by DE-A-195 32 412, and particularly of commercially available standard single nozzles from the Plasmatreat company (Germany), is particularly preferred.

As the inventors have surprisingly found, plasma polymer layers deposited in atmospheric pressure plasma, particularly by means of a plasma nozzle, and more particularly those plasma polymer layers, the deposition of which in step (i) involves feeding precursor compounds of the plasma polymer layer(s) into the region of the relaxing plasma of the atmospheric pressure plasma beam produced by means of a plasma nozzle, have such a high residual reactivity that they can be bonded without any further auxiliary agents, such as, e.g., adhesives, to a second plasma polymer layer of this kind (in the method according to one invention) or to a second substrate having a surface capable of reacting with the plasma polymer layer (in the method according to another invention). Experiments have shown that this is not possible with plasma polymer layers deposited in low-pressure plasma.

The inventors' explanation for the surprising findings forming the basis for the present invention is that the layer deposition rate at atmospheric pressure is higher by a factor of up to 1000 than in low-pressure plasma. Therefore, the sites of reactivity presumably have clearly less time for reacting with each other in the plasma polymer layer. It can be assumed that the clearly higher energy which is input by the plasma into deposited layers at low pressure and which causes sites of reactivity to react similarly as when being heavily tempered, adds to this.

The precursor compounds of the plasma polymer layer can be introduced together with the process gas 20. Plasma polymerization then occurs already in the "active" plasma. "Active" plasma is generally understood to mean plasma positioned within the volume confined by the electrodes. In the case of FIG. 3, the active plasma 28 is positioned within the plasma nozzle 6. By contrast, in the case of a "relaxing" plasma (sometimes also termed "afterglow" plasma), which in this patent application is sometimes also designated as relaxing region of the (atmospheric pressure) plasma, the plasma is positioned outside the excitation zone confined by the electrodes. In FIG. 3, the region of the relaxing plasma, i.e. the relaxing region of the plasma beam 40, is consequently situated between the nozzle outlet 30 and the substrate 1.

According to a preferred embodiment of the method according to the invention, precursor compounds of the plasma polymer layer are fed into the region of the relaxing plasma in step (i). This is illustrated in FIG. 3. It is less advantageous to introduce the precursor compounds together with the process gas since this may give rise to a preliminary reaction, for example prepolymerization, of the precursor compounds still in the region of the active plasma 28.

As is shown in FIG. 3, the precursor compounds of the plasma polymer layer are advantageously fed, in step (i), into the region of the relaxing plasma 40 with the aid of an adapter 44 fitted to the plasma nozzle 6. The adapter 44 has a channel through which the relaxing plasma beam 40 is passed. Precursor compounds of the plasma polymer layer are fed into the relaxing region of the atmospheric pressure plasma beam 40 via an opening 32 of the adapter. The direction of flow of the precursor compounds is shown by the arrow 42 in FIG. 3. It is possible by using such an adapter 44 to achieve a particularly controlled deposition of the plasma polymer layers. This is due, for example, to the fact that the use of such an adapter prevents aerial oxygen from accessing the relaxing region 40 of the plasma beam. It is also for this reason that the distance between the outlet end of the guide channel 46 and the surface of the substrate 1 to be coated is selected to be as small as possible. As a result, the pressure between the outlet end 46 and the substrate surface is greater than the ambient pressure, whereby aerial oxygen from the surroundings in the region of deposition of the plasma polymer layer 3 is prevented from arriving, in an uncontrolled manner, at the plasma beam 40. The appropriate distance, identified in FIG. 3 by the reference numeral f, preferably lies between 15 mm and 2 mm, and more preferably between 10 mm and 4 mm, with the greatest preference being approx. 6 mm. Adapters of this kind are described, for example, in DE 10 2005 059 706 A1. Adapters 44 that may be used according to the invention can be made, for example, of aluminium.

There are no particular limits to the form in which the precursor compounds are fed into the atmospheric pressure plasma. Depending on its type, the precursor compound may be introduced in a gaseous, liquid or solid, powder form. A carrier gas may optionally be used to transport the coating precursor compound. HMDSO, TEOS and HMDSN can be fed in, for example, in the form of a gas produced, e.g., by means of an evaporator (not shown in FIG. 3). Examples of carrier gases that can be used to feed in the precursor compounds are nitrogen, inert gases such as argon and helium, mixtures of such inert gases with compressed air, as well as forming gas and compressed air.

In the plasma beam 40, plasma polymerization of the precursor compounds takes place and a plasma polymer layer 3 is deposited on the substrate 1. As is symbolized by the arrow 50 in FIG. 3, the atmospheric pressure plasma nozzle 6 is moved relative to the substrate 1 along with the adapter 44. It is possible in this manner, by sweeping over the entire substrate surface, to completely provide a substrate with a plasma polymer layer.

Figure 1A:
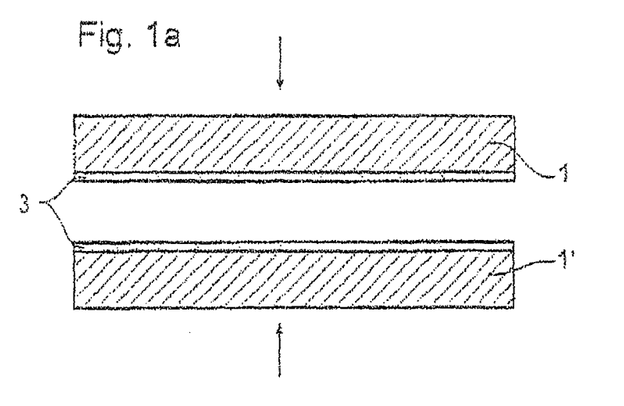
FIG. 1 shows the process of bringing into contact two parts to be joined which each have a plasma polymer layer deposited thereon, and the composite structure obtainable therewith.
Figure 1B:
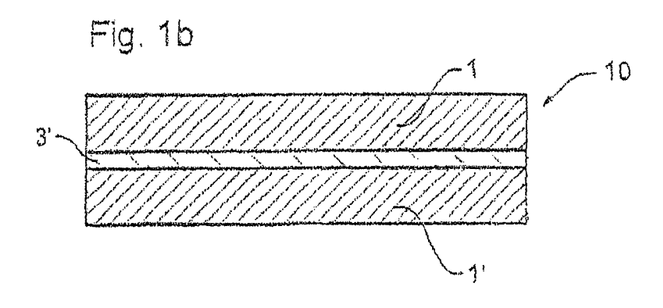

The substrates to be connected by means of the methods according to the invention may be parts to be joined. One such embodiment is illustrated in FIG. 1*a*. Here, a first substrate 1 and a second substrate 1', which are each provided with a plasma polymer layer 3, are brought into contact with each other. This is illustrated by the arrows. In this process, the substrates connect to each other forming a composite structure 10 in which the two substrates are connected via a plasma polymer layer 3' (see FIG. 1*b*). In the plasma polymer layer 3', the plasma polymer layers 3 are connected, preferably bonded, to each other. According to the invention, "bonded" connections are understood to mean connections in which the materials to be connected are held together by atomic or molecular forces. These connections thus particularly include unbreakable connections that can be disconnected only by destroying the means of connection.

Figure 2:
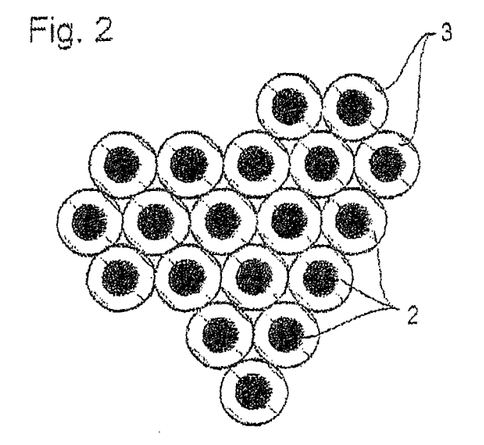
FIG. 2 illustrates a configuration of the method according to the invention in which the substrates are particles, particularly metal particles, that are each provided with plasma polymer layers.

The substrates can moreover be particles, for example metal particles. One such embodiment of the method according to the invention, in which numerous particles 2 are provided with plasma polymer layers 3, is illustrated in FIG. 2. Such particles 2 that are provided with, and particularly enclosed by, plasma polymer layers 3 can be obtained, for example, by feeding both the particles and the precursor compounds of the plasma polymer layer into the atmospheric pressure plasma where plasma polymer layers are deposited on the particles. In this process, the particles 2 are, in particular, enclosed by the plasma polymer layer 3. One such method for coating particles, notably metal particles, with plasma polymer layers is described, for example, in DE 10 2005 042 109 A1 and the corresponding WO 2007/028798. When the plasma polymer layers are brought into contact in FIG. 2, a composite structure is formed which contains particles 2 that are dispersed in a matrix of plasma polymer 3. It is particularly advantageous here for the layers to be brought into contact by way of compacting, for example in presses. Applying a vacuum to the pressing tool has proven to be suitable for strengthening the connection between the particles in the composite structure.

Composite structures of this kind can be formed into structural parts. This can be done by particularly simple ways and means in appropriately shaped pressing tools. As regards electrical insulating plasma polymers, electrical insulating components of high thermal conductivity can be obtained in this manner, if the particles consist of materials of high thermal conductivity. When using particles of magnetically soft materials such as, for instance, Fe—Si alloys, and particularly those having a Si content of approximately 6% by weight, magnetically soft components can be produced in which eddy current losses are reduced to a minimum.

According to the invention, "bringing into contact" is understood to mean that the surfaces to be connected, i.e. the surfaces of the two plasma polymer layers in the method according to one invention and the surface of the plasma polymer layer as well as the surface of the second substrate in the method according to another invention, contact each other in step (ii) so as to enable what is called auto-adhesion. Thus, in step (ii) of the methods according to the invention for connecting substrates, the surfaces to be connected are preferably brought into direct contact, in other words they directly contact each other. No further auxiliary agent, and particularly no adhesive, is accordingly used to connect the substrates in the methods according to the invention. According to the invention, reactions will take place when bringing the plasma polymer layer(s) into contact in step (ii). Which reactions will specifically occur depends on the chemical structure of the respective plasma polymer layer(s) and especially on that of the sites of reactivity on the surface. In this application, "sites of reactivity" of the plasma polymer layer are understood to mean those sites which, during the contacting process in step (ii), bring about a connection between the substrates, particularly by way of chemical reaction. The reactions that can be considered here include, for example, condensation reactions, addition reactions and recombinations of free radicals. Suitable condensation reactions are those between silanol groups and alcohols (i.e. silanol+silanol, alcohol+silanol, or alcohol+alcohol), between alcohol and carboxylic acid (with formation of ester), and between amine and carboxylic acid (with formation of amide). Reactions between SiH and unsaturated bonds such as C=C (hydrosilylation), addition reactions between alcohol and carbonyl as well as amine and carbonyl, and [2+4] cycloadditions, can be cited as addition reactions. According to a particularly preferred embodiment, the plasma polymer layers to be connected each have silanol groups on their surface which, in step (ii), form Si—O—Si bridges through condensation reactions, thus bonding the plasma polymer layers and hence also the substrates provided therewith.

Suitable precursor compounds are available for deposition of the desired plasma polymer layers. Tetraalkoxy(mono) silanes, tetraalkyl(mono)silanes, tetraacyloxy(mono)silanes and peralkylated siloxanes and silazanes, particularly di-, tri- and tetrasiloxanes (also cyclic ones) and disilazanes, are suitable for producing plasma polymer layers that typically have silanol groups as sites of reactivity capable of entering into condensation reactions in step (ii) of the method according to the invention.

Owing to their improved volatility and the associated convenient infeed with the carrier gas, the alkyl and alkoxy groups in the aforementioned compounds are preferably $C_{1-6}$ alkyl and $C_{1-6}$ alkyl groups, more preferably methyl, ethyl or propyl, and methoxy, ethoxy or propoxy. This also applies, mutatis mutandis, to the acyloxy groups. Here as well, these are preferably a $C_{1-6}$ acyloxy group, with the acetoxy group being particularly preferred. A few specific examples of preferred precursor compounds shall be given in the following: Tetramethoxysilane, tetraethoxysilane (TEOS), hexamethyldisiloxane (HMDSO), hexamethyldisilazane (HMDSN), tetramethylsilane, tetraacetoxysilane, octamethyltrisiloxane and octamethylcyclotetrasiloxane. In the case of the tetraalkylsilanes, for example the tetramethylsilane, the silanol groups may originate from the oxygen of the process gas and from traces of water.

In addition, silicon compounds having a Si—H bond (hydrosilanes) can be used to form silicoorganic plasma polymer layers. Trialkyl(mono)silanes, trialkoxy(mono)silanes, dialkyl(mono)silanes and dialkoxy(mono)silanes can, in particular, be considered here. Owing to the higher volatility of these compounds, $C_{1-6}$ alkyl groups and $C_{1-6}$ alkoxy groups are, here as well, preferred as alkyl and alkoxy groups, with methyl, ethyl or propyl, and methoxy, ethoxy or propoxy being even more preferred. The following compounds are specific examples of preferred hydrosilanes: triethoxysilane, triethylsilane, trimethoxysilane, trimethylsilane and diethylsilane. It has been observed that plasma polymer layers obtained from hydrosilanes such as those cited by way of example above can enter into hydrosilylation reactions (SiH+ unsaturated bond, particularly C=C) as well as into reactions between SiH and radical sites in step (ii). The unsaturated bonds (particularly C=C) and radical sites for these reactions can be obtained as precursor compounds in the plasma polymer layers by using, for example, unsaturated hydrocarbons, including acetylene.

Apart from acetylene, it is also possible to use, for example, ethene, propene, toluene, xylene, allylamine and—if effectively encapsulated against aerial oxygen—alkanes as precursor compounds, to obtain organic plasma polymer layers.

According to a preferred embodiment, the plasma polymer layers according to the invention are silicon-containing, particularly silicoorganic, plasma polymer layers.

In one embodiment of the invention, the atmospheric pressure plasma is an atmospheric pressure plasma beam generated by means of a plasma nozzle, and a strongly oxidizing process gas, for example oxygen or air (e.g. compressed air), is used as the process gas in the plasma nozzle. The strongly oxidizing process gas in the plasma fed in may destroy the structure of the precursor compounds fed in, yet ensures at the same time that the deposited plasma polymer layers have sites of reactivity (e.g. functional groups) that had still been absent in the precursor compounds. Therefore, non-reactive precursor compounds may also be used. Preferably, precursor compounds are used that have no unsaturated carbon-carbon (C—C) bonds, and particularly no C=C bonds.

It is particularly advantageous for the plasma polymer layers on the first and second substrates to be of the same type. For the purposes of the present application, "of the same type" means in this context that the plasma polymer layers were deposited by using the same precursor compounds and so preferably have the same type of sites of reactivity. In case the plasma polymer layers are of the same type—e.g., both layers have sites of reactivity in the form of silanol groups—chemical reactions such as, for example, condensation reactions could theoretically also take place within the respective plasma polymer layer and thus prior to bringing the plasma polymer layers into contact. As the inventors have found, this is hardly the case for plasma polymers due to steric hindrance. The sites of reactivity existing on the surface are frequently unable to find a coreactant, and therefore the reactions occur for the most part between the layers.

In order to prevent, to the largest extent possible, such a reaction within the respective plasma polymer layers and thus promote the reaction between the layers, it is advantageous for step (ii) to occur no more than 30 minutes after the deposition in step (i). It is particularly preferred for step (ii) to immediately follow step (i).

As the inventors have found, plasma polymer layers deposited in accordance with the invention retain their ability to undergo chemical reactions and, consequently, their connectability to second substrates, if they are treated and stored appropriately and activated before step (ii). In the case of plasma polymer layers having silanol groups (SiOH groups) on their surface, the following methods are available, for example:

(1) Converting the SiOH groups to ethers or esters, then storing the coated substrates thus treated in a dry place (particularly in the absence of water) and activating these, prior to step (ii), by addition of water, e.g. humidity. Conversion to ether is possible, for example, by treating the plasma polymer layer(s) with an alcohol such as methanol or ethanol, notably ethanol. Esters can be obtained by treating the plasma polymer layer(s) with acid and/or acid anhydride, for example acetic acid and/or acetic acid anhydride. The plasma polymer layer can subsequently be activated by addition of water and should then be subjected to step (ii) directly, advantageously at least within 30 minutes.

(2) Converting the SiOH groups to peroxides, then storing the correspondingly treated, coated substrates in a cold place, followed by heat activation prior to step (ii). Peroxides of any kind can be used to convert the SiOH groups to peroxides. Dibenzoyl peroxide can be considered here, for example. Storage "in a cold place" is understood here to mean storage of the substrate provided with the plasma polymer layer and treated with peroxide at a preferred temperature of −20 to 0° C., and "heat" activation is understood to mean treatment at a preferred temperature of at least 50° C., with a temperature in the range of from 80 to 120° C. being particularly preferred depending on the peroxides used.

Apart from the methods (1) and (2) described above, storage in moist conditions, i.e. storage in the presence of water, and preferably in water vapour, also allows plasma polymer layers having SiOH groups on their surface to retain their reactivity for a prolonged period of time.

Several measures have proven to be suitable for promoting connection of the substrates when bringing these into contact in step (ii). The first measure to be cited here is pressing the substrates together. The pressure to be applied during this pressing process depends on the surface texture, particularly the roughness of the surfaces to be connected, and also on the deformation behaviour of the substrates. For example, a pressure of at least 25 N/cm² has proven to be particularly suitable as regards coated silicon wafers. Furthermore, applying a vacuum between the substrates to be connected also promotes connection of the substrates. This evacuation between the two surfaces to be joined ensures good surface contact. As already explained, applying a vacuum is also advantageous in those cases where the substrates are particles, since this results in a better connection between the particles within the composite structure. In practice, a vacuum can be applied to the cavity of the pressing tool in which the particles enclosed by a plasma polymer layer are pressed together to form the composite structure (see FIG. 2).

Furthermore, it has proven to be advantageous for the bringing into contact in step (ii) to be carried out at elevated temperature, since this promotes, for example, the chemical reaction between the layers. The temperature is advantageously at least 80° C. What maximum temperature can be used in step (ii) depends on the thermal stability of the plasma polymer layer and of the substrate. In order to avoid unnecessary thermal stress, the temperature is preferably below the glass transition temperature ($T_G$) of the plasma polymer. Unlike, for example, in DE 42 42 059 C1, a softening of the plasma polymer can be avoided by using a maximum temperature in step (ii) which is below $T_G$ of the plasma polymer. According to a preferred embodiment, step (ii) is carried out at a temperature lying in a range of from 80° C. to ($T_G$ −10° C.).

There are no particular limits to the thickness of the plasma polymer layers in the present invention. The thickness preferably lies in the range of from 50 to 1000 nm. As a result, the pressing force applied during the pressing process, if any, can be selected to be particularly low. Such layer thicknesses are significantly above those typical of adhesion promoting layers. The latter normally lie in the range of from 10 to 20 nm. However, the method according to the invention for connecting substrates can also be successfully carried out—for example in the case of very smooth substrates—with very thin plasma polymer layers (having, for instance, a thickness of just 5 nm).

According to another embodiment of the method according to the invention, a plasma polymer layer is deposited in an atmospheric pressure plasma only on the first substrate and is brought into contact with a second substrate having a surface capable of reacting therewith. The surface of the second substrate consequently has sites of reactivity on its surface as already described with regard to the plasma polymer layers. The second substrate may be, for example, a glass, metal or plastic substrate. Examples of suitable plastic substrates are those made from ethylene/vinyl alcohol copolymers and ethylene/vinyl acetate copolymers, polycarbonate (PC) and polymethyl methacrylate (PMMA). Those plastic materials which do not by themselves have sites of reactivity within the meaning of the present invention may also be used as substrates in this embodiment of the method according to the invention, provided they were subjected to an appropriate pretreatment to produce such sites of reactivity on their surface. Pretreatments of this kind include, for example, partial fluorination in the presence of oxygen, wet chemical treatment (with, e.g., sulfuric acid, or pickling) or plasma activation. Polyethylene (PE) and polypropylene (PP) are examples of inherently inert plastics that can be made suitable for the method according to the invention by such a pretreatment.

The second substrate preferably has—by itself or following a suitable pretreatment—superficial O or OH groups and can thus be connected, in the method according to the invention, to the plasma polymer layer on the first substrate, if this layer comprises, for example, silanol groups. In that case, the substrates connect to each other through condensation reactions. Glass substrates, for example, have superficial terminal O or OH groups capable of reacting with the plasma polymer layer of the first substrate through condensation.

As the inventors have observed, the proportion of OH groups in silanol-containing plasma polymer layers deposited in an atmospheric pressure plasma is significantly higher than in corresponding plasma polymer layers deposited in low-pressure plasma using the same precursor compounds. Owing to the insufficient density of OH groups, silanol-containing plasma polymer layers deposited in low-pressure plasma have proven to be unsuitable for connecting substrates.

As the inventors have found, certain process parameters are particularly suitable for producing a layer having as many sites of reactivity in the form of silanol groups as possible when feeding the precursor compounds of the plasma polymer layer (for example HMDSO) into the region of the relaxing plasma of the atmospheric pressure plasma beam (reference number 40 in FIG. 3), these being:

(1) Supply rate of precursor compound (e.g. HMDSO) ranging from 30 to 100 g/h;

(2) Distance (designated by the reference numeral e in FIG. 3) between the supply channel 32 and the substrate ranging from 7 to 16 mm; and (3) Oxygen content of the process gas ranging from 10 to 30%.

According to a particularly preferred embodiment of the method according to the invention, all of the aforementioned process parameters (1) to (3) are satisfied at the same time.

Finally, a substrate temperature of between 10 and 70° C. has proven to be advantageous during deposition of the plasma polymer layer in step (i).

EXAMPLES

Example 1

A plasma polymer layer on the basis of a silicoorganic precursor compound was applied in a thickness of around 400 nm to the substrates (silicon wafers) to be adhered together using an atmospheric pressure plasma nozzle having an adapter fitted thereto, as schematically shown in FIG. 3. 50 g/h of HMDSO were fed, as the precursor compound, into the afterglow plasma using 2 L/min of $N_2$ carrier gas. The distance between the inlet passage for the HMDSO-carrier gas mixture and the nozzle outlet (designated by the reference numeral d in FIG. 3) was 7 mm, and the distance between this inlet passage and the surface of the substrate 1 (designated by the reference numeral e in FIG. 3) was likewise 7 mm. 29 L/min of compressed air were used as the process gas. The relative velocity between substrate and plasma nozzle was 20 m/min. Following deposition of the layers, the silicon wafers were directly pressed together by applying pressure (0.1 kN/cm$^2$) and heat (120° C.).

A bonded connection was obtained between the two wafers. Peel stress on this composite results in a destruction of the silicon wafers or in cohesive fracture within the coatings. There was no adhesive failure.

Example 2

A plasma polymer layer was deposited on a silicon wafer (or gold-sputtered silicon wafer for IR analysis) using the atmospheric-pressure (AP) plasma system PFW 10 from the Plasmatreat company (high-frequency generator: PG5001) with an adapter on the nozzle outlet as is schematically shown in FIG. 3. To form the layer, the plasma was created in the nozzle by using compressed air as the process gas. The plasma is generated thereby through arc-like discharges by applying high voltage with a frequency between 17 and 25 kHz. Evaporated hexamethyldisiloxane (HMDSO) was fed at the nozzle outlet into the plasma thus generated using nitrogen as the carrier gas.

The composition of the plasma polymer layer, determined by means of X-ray photoelectron spectroscopy (XPS), was as follows:

Si: 28-26 at %
O: 51-48 at %
C: 21-26 at %

Figure 4A:
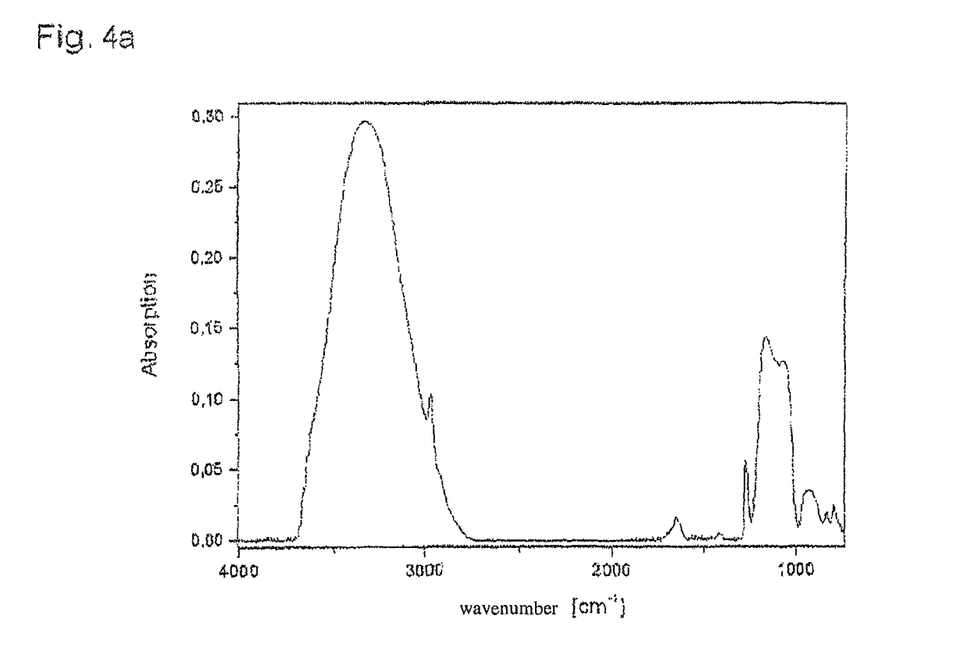

Prior to tempering (storage at 100° C. for 30 min), the layer had the IR spectrum shown in FIG. 4*a*. After tempering (with the entire surface not covered with material to be joined), the IR spectrum of FIG. 4*b* was obtained. Tempering without coverage with the material to be joined, which would prevent IR analysis, is supposed to simulate in the present case what happens in step (ii) of the method according to the invention.

Figure 4B:
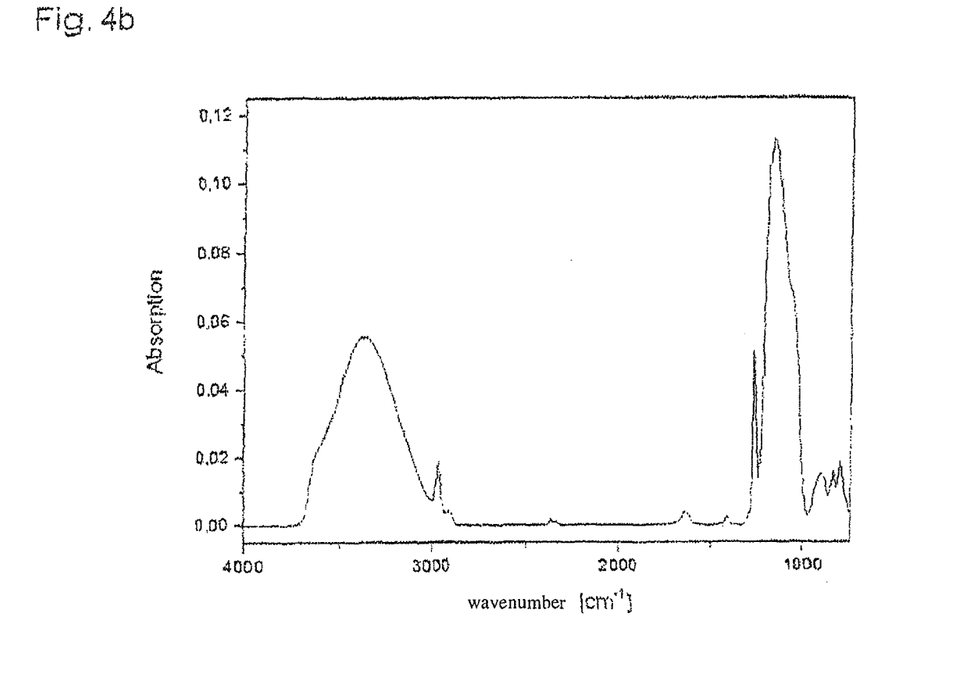

A comparison between the IR spectra of FIGS. 4b and 4a shows a decrease in the "proportion of water" between 2900 and 3600 cm$^{-1}$ and in the Si—OH bonds at around 950 cm$^{-1}$ in favour of a subsequent reaction of the Si—O bonds in the range of from 1100 to 1200 cm$^{1-}$.

Directly after being prepared, the silicon substrates with the deposited layers (thickness approx. 200 nm) were stored, together with the material to be joined (provided with the same layer), under pressure and at 120° C. for 30 min. This was followed by slow cooling down to room temperature at the same pressure. When subject to peel load, the composite experiences a cohesive failure within the plasma polymer layer. The same behaviour was observed when pressing was carried out for 1 hour at room temperature and for 30 minutes at 80° C.

Comparative Example

By way of comparison, plasma polymer layers deposited in low-pressure plasma were studied. A deposition chamber suitable for plasma polymerization was used for deposition (see EP 1 432 529 B1 and DE 197 48 240 C2). A plasma for layer deposition was generated inside the process chamber by excitation whilst introducing the process gases as well as the silicoorganic precursor compounds (i.e. HMDSO for these experiments). A layer composition similar to that obtained in example 2 was produced by matching the process steps. XPS analysis gave the following composition:
Si: 26 at %
O: 43 at %
C: 31 at %

Figure 5A:
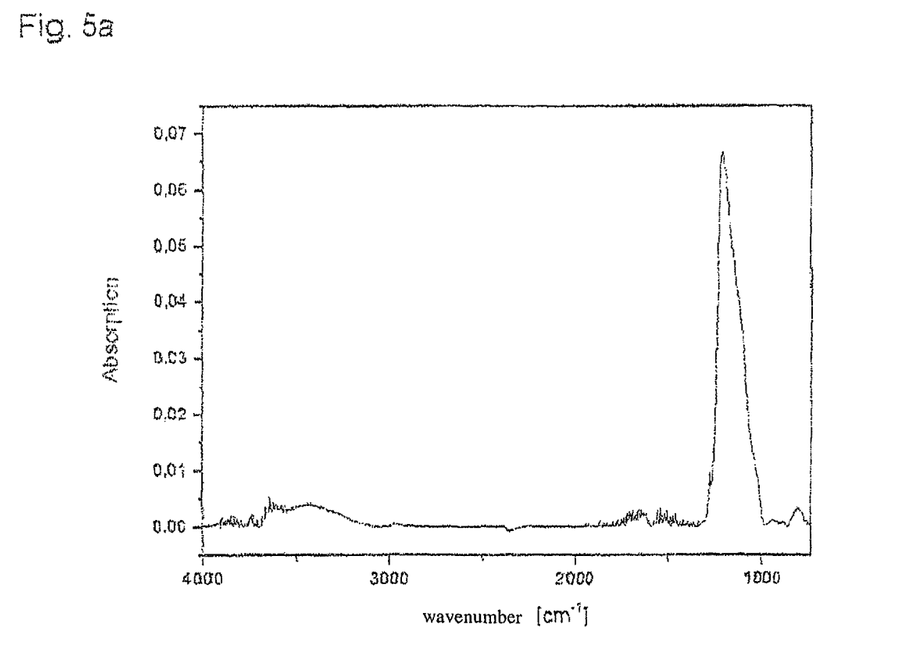
Figure 5B:
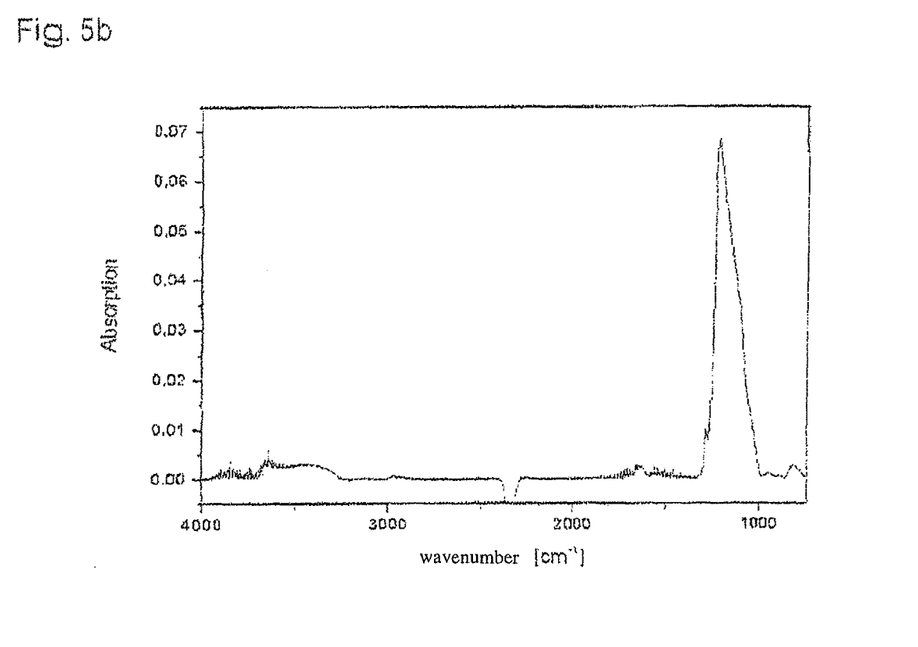

Immediately after preparation, the samples were stored, as in example 2, under pressure and at the same temperatures (120° C.) for 30 minutes. The IR spectrum shown in FIG. 5a resulted prior to "pressing". Following tempering, the spectrum showed only very slight changes (FIG. 5b).

It is impossible with the layers from the low-pressure plasma to produce coherent polysurfaces on the same substrate materials. Once the samples have cooled down and the pressure has been taken away from the coated parts to be joined, the latter fall apart. The samples also do not show any changes on the surfaces of the plasma polymer layer which would indicate a connection between the two parts to be joined. The layer reactions which are possible, for example under the influence of pressure and heat, with AP plasma (see examples 1 and 2) cannot be achieved with layers from low-pressure plasma.

The invention claimed is:

1. A method for connecting substrates, comprising:
   (i) depositing a plasma polymer layer on each of a first and a second substrate by means of an atmospheric pressure plasma;
   (ii) bringing the plasma polymer layers into contact; and
   (iii) wherein apart from the plasma polymer layers, no further auxiliary agent is used to connect the substrates.

2. The method according to claim 1, wherein the atmospheric pressure plasma comprises an atmospheric pressure plasma beam generated by means of a plasma nozzle using a process gas.

3. The method according to claim 2, wherein precursor compounds of the plasma polymer layers are fed into a region of a relaxing plasma of the atmospheric pressure plasma beam so as to allow for deposition of the plasma polymer layers in step (i) and wherein the plasma polymer layers deposited in step (i) have sites of reactivity from the precursor compounds and the process gas.

4. The method according to claim 3, wherein the structure of the precursor compounds used for deposition of the plasma polymer layers in step (i) is destroyed in the atmospheric pressure plasma.

5. The method according to claim 3, wherein the precursor compounds do not comprise unsaturated C—C bonds.

6. The method according to claim 3, wherein the precursor compounds are selected from the group consisting of tetraalkylmonosilanes, trialkylmonosilanes, dialkylmonosilanes, tetraalkoxymonosilanes, trialkoxymonosilanes, dialkoxymonosilanes, tetraacyloxymonosilanes, peralkylated siloxanes and silazanes.

7. The method according to claim 2 wherein the process gas comprises a strongly oxidizing gas.

8. The method according to claim 1, wherein the plasma polymer layers on the first and second substrates are of the same type.

9. The method according to claim 1, wherein step (ii) is carried out at a temperature below the glass transition temperature of the plasma polymer of the plasma polymer layers.

10. The method according to claim 1, wherein one or both of the substrates comprise component parts to be joined.

11. The method according to claim 1, wherein one or both of the substrates comprise particles.

12. A method for connecting substrates, comprising:
   (i) depositing a plasma polymer layer on a first substrate by means of an atmospheric pressure plasma;
   (ii) bringing the plasma polymer layer into contact with a second substrate having a surface capable of reacting with the plasma polymer layer; and
   (iii) wherein apart from the plasma polymer layer, no further auxiliary agent is used to connect the substrates.

13. The method according to claim 12, wherein precursor compounds of the plasma polymer layer are fed into a region of a relaxing plasma of the atmospheric pressure plasma beam so as to allow for deposition of the plasma polymer layer in step (i) and wherein the plasma polymer layer deposited in step (i) has sites of reactivity from the precursor compounds and a process gas.

14. The method according to claim 13 wherein the process gas comprises a strongly oxidizing gas.

15. The method according to claim 12, wherein the second substrate is selected from the group consisting of glass, metal and plastic.

16. The method according to claim 12, wherein step (ii) is carried out at a temperature below the glass transition temperature of the plasma polymer of the plasma polymer layer.

17. The method according to claim 12, wherein one or both of the substrates comprise particles.

18. The method of claim 12 wherein one or both of the substrates comprise component parts to be joined.

19. A composite structure comprising a first and a second substrate that are connected to each other via atmospheric plasma deposited polymer layers, wherein, apart from the plasma polymer layers, no further auxiliary agent is used to connect the substrates.

* * * * *